United States Patent
Yang et al.

(10) Patent No.: US 6,306,722 B1
(45) Date of Patent: Oct. 23, 2001

(54) METHOD FOR FABRICATING SHALLOW TRENCH ISOLATION STRUCTURE

(75) Inventors: Gwo-Shii Yang, Hsinchu; Tri-Rung Yew, Hsinchu Hsien; Coming Chen, Taoyuan Hsien; Water Lur, Taipei, all of (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 09/304,143

(22) Filed: May 3, 1999

(51) Int. Cl.[7] ............... H01L 21/76; H01L 21/31; H01L 21/469
(52) U.S. Cl. ............... 438/424; 438/785
(58) Field of Search ............... 438/430, 424, 438/608, 434, 785, 766

(56) References Cited

U.S. PATENT DOCUMENTS

| | | | |
|---|---|---|---|
| 4,571,819 | * | 2/1986 | Rogers et al. . |
| 4,652,463 | * | 3/1987 | Peters . |
| 5,406,111 | * | 4/1995 | Sun . |
| 5,470,802 | * | 11/1995 | Gnade et al. . |
| 5,473,176 | * | 12/1995 | Kakumoto . |
| 5,604,159 | * | 2/1997 | Cooper et al. . |
| 5,661,830 | * | 8/1997 | Nishimoto . |
| 5,677,231 | * | 10/1997 | Maniar et al. . |
| 5,855,962 | * | 6/1999 | Cote et al. . |
| 5,913,132 | * | 6/1999 | Tsai ...................... 438/434 |

OTHER PUBLICATIONS

Wolf, "Silicon Processing for the VLSI Era", vol. 1 pp. 189–191, 1986.*

* cited by examiner

Primary Examiner—John F. Niebling
Assistant Examiner—Ron Pompey

(57) ABSTRACT

A method for fabricating, a shallow trench isolation structure. A pad oxide layer and a silicon nitride layer are formed in sequence on a substrate. A trench is formed in the substrate and a liner oxide layer is formed on a sidewall of the trench. A doped silicon dioxide layer is formed on the silicon nitride layer and fills the trench. An annealing process is performed to density the doped silicon dioxide layer. A portion of the doped silicon dioxide layer is removed to expose the silicon nitride layer by a planarization process.

22 Claims, 2 Drawing Sheets

METHOD FOR FABRICATING SHALLOW TRENCH ISOLATION STRUCTURE

BACKGROUND OF THE INVENTION

1. Field of the Invention

The present invention relates to a method for fabricating a shallow trench isolation (STI) structure. More particularly, the present invention relates to a method for fabricating a shallow trench isolation structure filled with doped silicon dioxide.

2. Description of the Related Art

In an integrated circuit, an isolation structure is needed to isolate devices. Since a shallow trench isolation structure has advantages of scalability and a good isolation ability, this technology is preferably used in the sub-micron process.

In the conventional method for forming a shallow trench isolation structure, an anisotropic etching process is performed with silicon nitride serving as a mask to form a steep trench in a substrate. An undoped silicon dioxide layer is formed within the trench and a shallow trench isolation structure is thus formed. The substrate is then dipped in a dilute hydrofluoric acid (HF) solution to remove impurities formed during the above processes.

Usually, a portion of the undoped silicon dioxide layer is lost during the subsequent dipping process so that defects are formed in the undoped silicon dioxide layer mid the reliability of the shallow trench isolation structure is decreased. An annealing, process is performed at about 1100° C. to densify the undoped silicon dioxide layer before the dipping process to prevent the undoped silicon dioxide layer from losing material.

However, due to a large difference in thermal expansion coefficients and Young's modulus between the substrate and the undoped silicon dioxide layer, significant substrate stress of several hundred MPa occurs during the annealing process. Due to this stress, crystallographic detects occur in the undoped silicon dioxide layer, which defects enhance junction leakage and sub-threshold leakage. In dense pattern areas and high packing density memory devices, this causes the devices to fail.

SUMMARY OF THE INVENTION

Accordingly, the present invention provides a method for fabricating a shallow trench isolation structure that reduces stress incurred during the annealing process, junction leakage and sub-threshold leakage.

To achieve these and other advantages and in accordance with the purpose of the invention, as embodied and broadly described herein, the invention provides a method for fabricating a shallow trench isolation structure. The method includes the following steps. A pad oxide layer and a silicon nitride layer are formed in sequence on a substrate. A trench formed in the substrate, and a liner oxide layer is formed on a sidewall of the trench. A doped silicon dioxide layer is formed on the silicon nitride layer and fills the trench. An annealing process is performed to densify the doped silicon dioxide layer. A portion of the doped silicon dioxide layer is removed to expose the silicon nitride layer by a planarization process.

In the invention, the doped silicon dioxide layer doped with germanium, nitrogen or refractory metals is used to form the shallow trench isolation structure. The thermal expansion coefficient and Young's modulus of the doped silicon dioxide layer is influenced by the dopants. Therefore, the thermal expansion coefficient and Young's modulus of the doped silicon dioxide layer are modulated by controlling the doping level to be comparable with the substrate. As a result stress incurred during the annealing process, is reduced. Furthermore, junction leakage and sub-threshold leakage are both reduced and the annealing process can be performed at lower temperature. Additionally, since the hydrofluoric acid etching rate of the doped silicon dioxide layer is different from that of the silicon dioxide layer, the kink effect can be also eliminated.

It is to be that both the foregoing general description, and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1A:
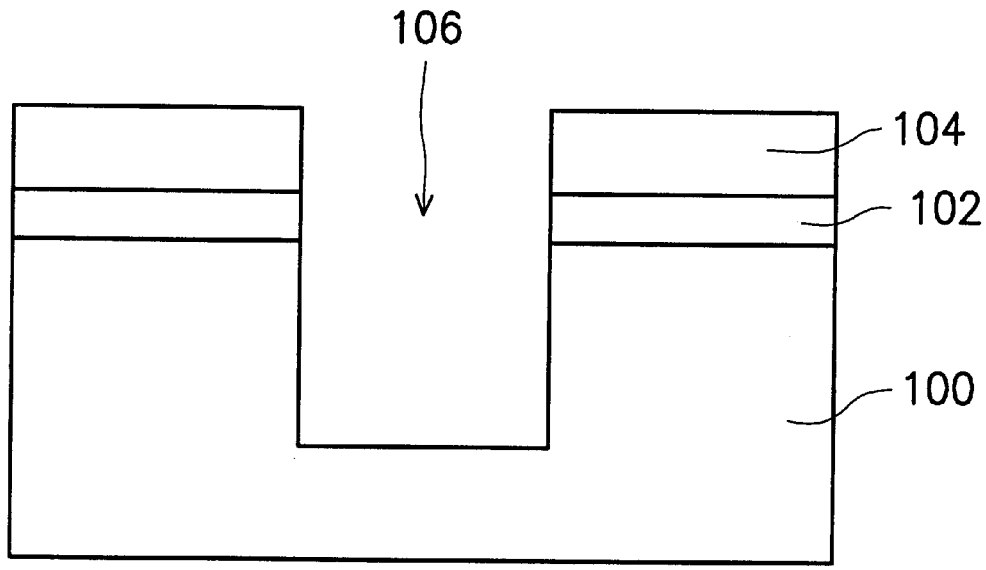
FIGS. 1A through 1D are schematic, cross-sectional diagrams used to depict steps in a method for fabricating a shallow trench isolation structure.

Reference will now be made in detail to the present preferred embodiments of the invention, examples of which are illustrated in the accompanying drawings. Wherever possible, the same reference numbers are used in the drawings and the description to refer to the same or like parts.

FIGS. 1A through 1D are schematic, cross-sectional diagrams used to depict steps in a method for fabricating a shallow trench isolation structure.

Referring to FIG. 1A, a pad oxide layer 102 and a silicon nitride layer 104 are formed in sequence on a substrate 100. A trench 106 is formed in the substrate 100. The pad oxide layer 102 is about 100 to 200 Å thick, and the silicon nitride layer 104 is about 1000 to 2000 Å thick. The step of forming the trench 106 includes anisotropic etching.

Figure 1B:
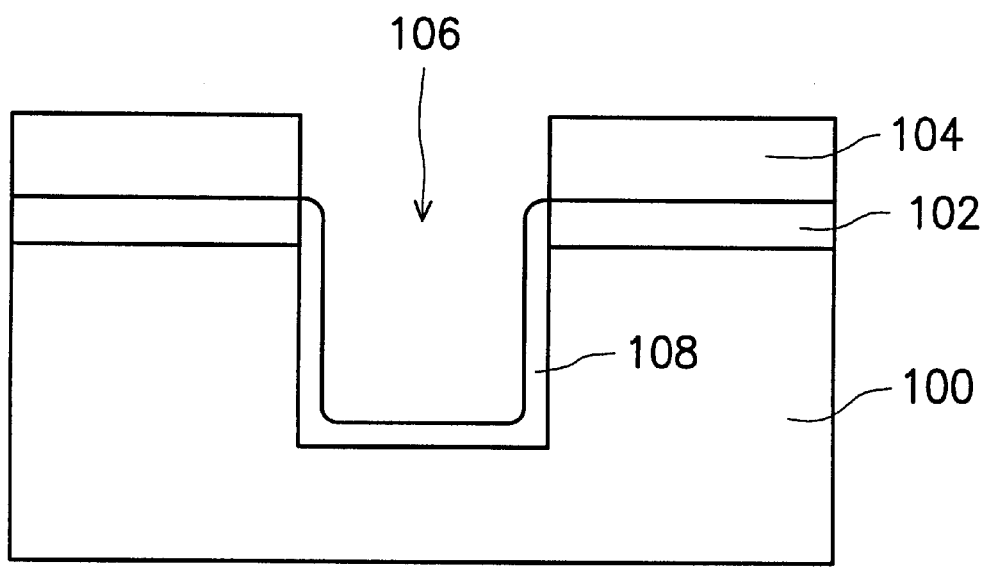

Referring to FIG. 1B, a liner oxide layer 108 which is about 100 to 500 Å thick, is formed on a sidewall of the trench 106. The liner oxide 108 layer 108 meets the pad oxide layer 102. The step of forming the liner oxide layer 108 includes thermal oxidation.

Figure 1C:
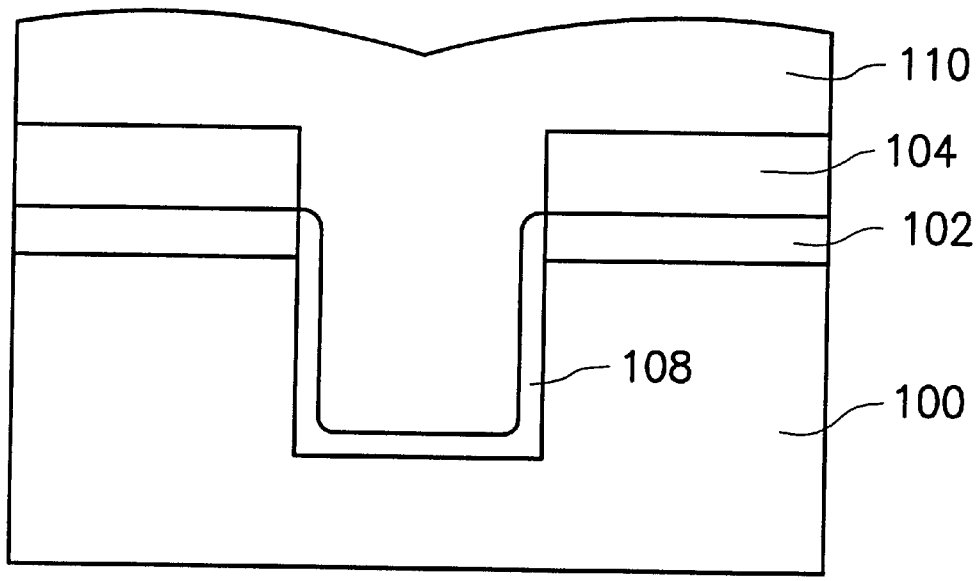

Referring to FIG. 1C. a doped silicon dioxide layer 110 is formed on the silicon nitride layer 104 and fills trench 106. The material doped into the doped silicon dioxide layer 110 is selected from a group consisting of germanium, nitrogen and refractory metals.

There are some methods used to form the doped silicon dioxide layer 110 having a germanium dopant.

In one method, a low pressure chemical vapor deposition (LPCVD) process or a high density plasma chemical vapor deposition (HDPCVD) process is performed at about 250 to 600° C. with a mixture of silane ($SiH_4$), germane ($GeH_4$) and oxygen serving as a gas source to form the doped silicon dioxide layer 110. Since germane reacts with oxygen to produce germanium oxide ($GeO_2$), the doped silicon dioxide layer 110 contains germanium oxide.

In the other method a sub-atmospheric chemical vapor deposition (SACVD) process or a atmospheric pressure chemical vapor deposition (APCVD) process is performed at about 250 to 600° C. with a mixture of tetraethosiloxane (TEOS) and tetramethoxy germanium ($Ge(OCH_3)_4$) serving as a gas source to form the doped silicon dioxide layer 110. In the process, tetramethoxy germanium is a precursor for forming germanium oxide. During the process, tetramethoxy germanium is transformed into germanium oxide, so the doped silicon dioxide layer 110 contains germanium oxide.

For achieving, nitrogen doping, ammonia nitrogen monoxide ($N_2O$) or nitrogen is added while performing a low pressure chemical vapor deposition process or a high density plasma chemical vapor deposition process to form the doped. silicon dioxide layer 110.

The refractory metal doped into the doped silicon dioxide layer 110 is a metal such as titanium. For example, tetraethoxy titanium ($Ti(OC_2H_5)_4$) is added while performing, a chemical vapor deposition process to form the doped silicon dioxide layer 110.

Figure 1D:
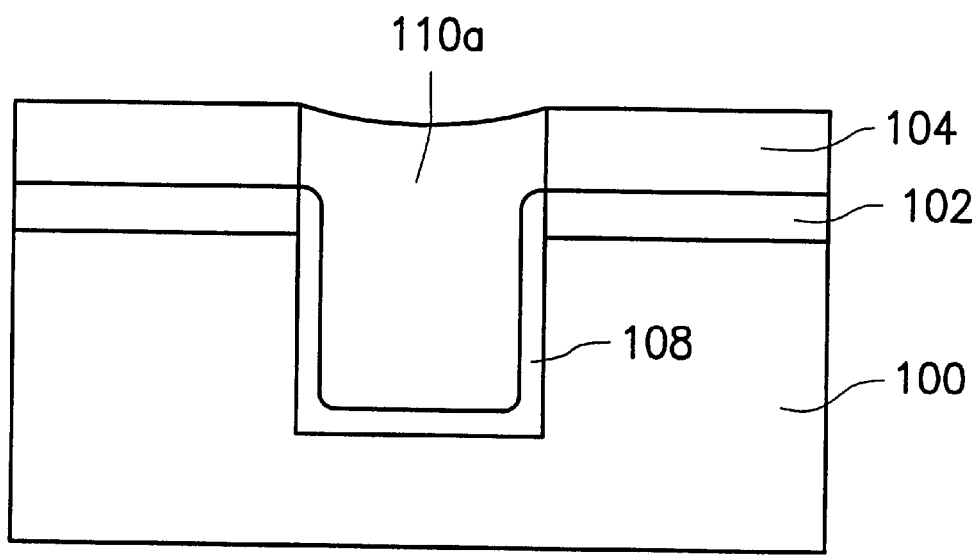

Referring to FIG. 1D, the doped silicon dioxide layer 110 (FIG. 3) is densified by performing an annealing process. The annealing process is performed at about 800 to 950° C. A portion of the doped silicon dioxide layer 110 (FIG. 3) is removed to expose the silicon nitride layer 104 by, for example, chemical-mechanical polishing (CMP). Then, a doped silicon dioxide layer 110a is formed within the trench 106. A wet etching process is performed with hydrofluoric acid serving as an etchant to remove native oxide formed during the above processes.

According to the foregoing, the advantages of the invention include the following:

1. The thermal expansion coefficient and Young's modulus of the doped silicon dioxide layer is influenced by the dopants. Therefore, the thermal expansion coefficient and Young's modulus of the doped silicon dioxide layer are modulated by controlling, the doping level to be comparable with the substrate. By controlling the doping level, stress incurred during the annealing process is reduced. Furthermore, junction leakage and sub-threshold leakage are both reduced.

2. Glass transition temperature of silicon dioxide is also influenced by the dopants. For example, glass transition temperature of doped silicon dioxide is reduced From 1160 to 800° C. when the mole percentage of germanium oxide in the doped silicon dioxide layer is about 4. According to this, the annealing process can be performed at lower temperature to densify the doped silicon dioxide layer. Since the annealing process is performed at lower temperature, stress incurred during the annealing process is reduced and the stability of chemical-mechanical polishing is improved.

3. The hydrofluoric acid etching rate of the dopant is different from that of the silicon dioxide. For example the hydrofluoric acid etching rate of germanium oxide is lower than silicon dioxide. As a result the dopants prevent the doped silicon dioxide layer from losing material during the dipping process. Additionally, the kink effect can be also eliminate by preventing the doped silicon dioxide layer from losing material.

4. Step coverage of the doped silicon dioxide layer is better than that of the undoped silicon dioxide layer, so that the doped silicon dioxide layer easily fills the trench.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for fabricating a shallow trench isolation structure, comprising the steps of:
    forming a trench in a substrate;
    forming a liner oxide layer on a surface of the substrate exposed within the trench;
    forming a doped silicon dioxide layer with a dopant concentration, so as to have a thermal expansion coefficient and a Young's modulus comparable to the substrate, over the substrate and filling the trench to be adjacent to the liner oxide layer in such a way that a stress incurred in a subsequent annealing process is reduced;
    performing the annealing process to densify the doped silicon dioxide layer; and
    performing a planarizing process to remove a portion of the doped silicon dioxide layer.

2. The method of claim 1, wherein the doped silicon dioxide layer includes an oxide with geranium .

3. The method of claim 2, wherein either a low pressure chemical vapor deposition process or a high density plasma chemical vapor deposition process is performed with a mixture of silane, germane and oxygen serving as a gas source to form the doped silicon dioxide layer.

4. The method of claim 3, wherein a temperature of forming the doped silicon dioxide layer is about 250 to 600° C.

5. The method of claim 2, wherein either a sub-atmospheric pressure chemical vapor deposition process or a atmospheric pressure chemical vapor deposition process is performed with a mixture of tetraethosiloxane and tetramethoxy germanium serving as a gas source to form the loped silicon dioxide layer.

6. The method of claim 5, wherein a temperature of forming the doped silicon dioxide layer is about 50 to 600° C.

7. The method of claim 1, wherein the doped silicon dioxide layer includes an oxide with nitrogen.

8. The method of claim 7, wherein either a low pressure chemical vapor deposition process or a high density plasma chemical vapor deposition process is performed with a gas source which is selected from a group consisting of ammonia, nitrogen monoxide and nitrogen to form the doped silicon dioxide layer.

9. The method of claim 1, wherein the doped silicon dioxide layer is doped with refractory metals.

10. The method of claim 1, wherein the doped silicon dioxide layer includes an oxide with titanium.

11. The method of claim 10, wherein either a sub-atmospheric pressure chemical vapor deposition process is or an atmospheric pressure chemical vapor deposition process is performed with tetraethoxy titanium to form the doped silicon dioxide layer.

12. The method of claim 1, wherein the annealing process is performed at about 800 to 950° C.

13. The method of claim 1, wherein the planarization process includes chemical-mechanical polishing.

14. A method for fabricating a shallow trench isolation substrate, comprising the steps of:
    providing a substrate having a trench;
    forming a doped silicon dioxide layer over the substrate and filling the trench, wherein a material doped into the silicon dioxide layer is selected from a group consisting of germanium, nitrogen and refractory metals, and a dopant concentration level is controlled to have a thermal expansion coefficient and a Young's modulus comparable to the substrate;

adjusting the doped material to have a mole percentage in the doped silicon dioxide layer such that a glass transition temperature of the doped silicon dioxide layer is reduced to allow a lower temperature for an annealing process;

performing the for annealing process on the doped silicon dioxide layer; and performing a planarization process on the doped silicon dioxide layer.

15. The method of claim 14, wherein either a low pressure chemical vapor deposition process or a high density plasma chemical vapor deposition process is performed with a mixture of silane, germane and oxygen serving as a gas source at about 250 to 600° C. to form the doped silicon dioxide layer.

16. The method of claim 14, wherein either a sub-atmospheric pressure chemical vapor deposition process or an atmospheric pressure chemical vapor deposition process is performed with a mixture of tetraethosiloxane and tetramethoxy germanium serving as a gas source at about 250 to 600° C. to form the doped silicon dioxide layer.

17. The method of claim 14, wherein either a low pressure chemical vapor deposition process or a high density plasma chemical vapor deposition process is performed with a gas source which is selected from a group consisting of ammonia, nitrogen monoxide and nitrogen to form the doped silicon dioxide layer.

18. The method of claim 14, wherein the doped silicon dioxide layer includes an oxide with titanium.

19. The method of claim 18, wherein either a sub-atmospheric pressure chemical vapor deposition process or an atmospheric pressure chemical vapor deposition process is performed with tetraethoxy titanium to form the doped silicon dioxide layer.

20. The method of claim 14, wherein the annealing process is performed at about 800 to 950° C.

21. A method for fabricating a shallow trench isolation structure, comprising the steps of:

forming a trench in a substrate;

filling a doped dielectric layer to the trench to form the shallow trench isolation structure, wherein the doped dielectric layer has a dopant concentration level that is controlled to have a thermal expansion coefficient and a Young's modulus comparable to the substrate;

performing the annealing process to densify the doped dielectric layer; and performing a planarizing process to remove a portion of the doped dielectric layer.

22. The method of claim 32, wherein the doped dielectric layer comprises doped silicon oxide.

* * * * *